United States Patent [19]

Brueck et al.

[11] Patent Number: 5,343,292
[45] Date of Patent: Aug. 30, 1994

[54] METHOD AND APPARATUS FOR ALIGNMENT OF SUBMICRON LITHOGRAPHIC FEATURES

[75] Inventors: Steven R. J. Brueck; Saleem H. Zaidi, both of Albuquerque, N. Mex.

[73] Assignee: University of New Mexico, Albuquerque, N. Mex.

[21] Appl. No.: 599,949

[22] Filed: Oct. 19, 1990

[51] Int. Cl.$^5$ ............................................. G01B 9/02
[52] U.S. Cl. .................................. 356/363; 356/356; 356/401
[58] Field of Search ............... 356/356, 401, 363, 128; 250/237 G, 231

[56] References Cited

U.S. PATENT DOCUMENTS

| | | | |
|---|---|---|---|
| 4,332,473 | 6/1982 | Ono | 356/356 |
| 4,545,683 | 10/1985 | Markle | 356/400 |
| 4,631,416 | 12/1986 | Trutna | 356/356 |
| 4,710,026 | 12/1987 | Magome et al. | 356/356 |
| 5,100,237 | 3/1992 | Wittekoek et al. | 356/400 |

OTHER PUBLICATIONS

Durande, A., et al., "Measure de la Temperature de Surface d'un Echantillon au Cours d'un Traitement par Plasma"; CNRS-CIT Alcatel, CNRS UA 884.

van den Brink, M. A., et al., "Performance of a Wafer stepper with automatic intra-die registration correction", SPIE vol. 772, *Optical Microlithography VI* (1987).

Weissman, Eric M., "Moire interferometry near the the theoretical limit", May 1, 1982, vol. 21, No. 9, *Applied Optics.*

Primary Examiner—Samuel A. Turner
Attorney, Agent, or Firm—Albert Sopp

[57] ABSTRACT

In the manufacture of microelectronic and optoelectronic circuitry, an arrangement for aligning submicrometer lithographic features on a wafer illuminating a diffraction grating on the wafer with an interferometrically established radiation intensity pattern having a predetermined relationship to the lithographic features in another level of the wafer that is to be exposed, the radiation diffracted from the illuminated grating forming moire interference pattern providing spatial amplification of the grating period for alignment purposes by the ratio of the moire fringe spacing to the grating period.

14 Claims, 2 Drawing Sheets

METHOD AND APPARATUS FOR ALIGNMENT OF SUBMICRON LITHOGRAPHIC FEATURES

BACKGROUND

Feature dimensions in semiconductor manufacturing, especially in the field of microelectronic and optoelectronic devices (e.g., micro laser semiconductor integrated circuits) are continually becoming smaller. Present manufacturing processes are at roughly 0.8 μm. The next generation plans are to 0.5 μm followed by 0.35 μm within the next five years or so and are expected to reach about 0.15 μm critical dimensions (CD) thereafter. While substantial effort is being expended on lithographic techniques for producing these very small feature sizes, considerably less effort has been devoted to the equally important issues of alignment and overlay between mask levels. Generally, registration of two structures to within ⅓ to 1/5 of one CD is required for successful, high yield manufacturing.

In connection with the present invention, the term "alignment" is used to refer to the process of assuring reticle-to-wafer registration when the wafer is in the exposure tool. The term "overlay" refers to after-exposure measure of how accurately the process was carried out. More generally, "overlay" may also refer to the overall success of registering full patterns of the two mask levels and not merely or only the alignment marks.

An important distinction between "alignment" and "overlay" is one of time: "alignment" occurs in the stepper before the upper level exposure is carried out; "overlay" is a measure of success in the alignment process after the upper level has been exposed and developed.

Alignment and overlay measurement techniques have been identified in the industry as substantial problems which pose very substantial limits on the progress in developing future generations of integrated circuits.

Many alignment techniques are proprietary. An exception is the alignment system used by Phillips/ASM [Performance of a wafer stepper with automatic intradie registration correction, M. A. van den Brink, S. Wittekoek, H. F. D. Linders, F. J. van Hout, and R. A. George, SPIE 772, Optical Microlithography VI (1987)]. In this technique, which forms the basis of the alignment technique implemented in Phillips/ASM steppers, an incident laser beam (HeNe laser at 633 nm) is diffracted from a phase grating on the wafer (16-μm period 400×80-μm² overall size) and imaged onto a second grating on the reticle. The intensity of the odd diffraction orders transmitted through the reticle, isolated by a spatial filter, is detected as the alignment signal.

Many other steppers rely on a small number of alignment marks, often in a nested L-pattern that are imaged from the reticle to the wafer. It is important to emphasize that alignment will likely remain an electromagnetic process using optical or UV photons—and hence limited by diffraction effects.

BRIEF DESCRIPTION OF THE DRAWINGS

Reference is now made to the drawings in which like numerals refer to like parts and in which.

DETAILED DESCRIPTION OF THE INVENTION

Figure 1:
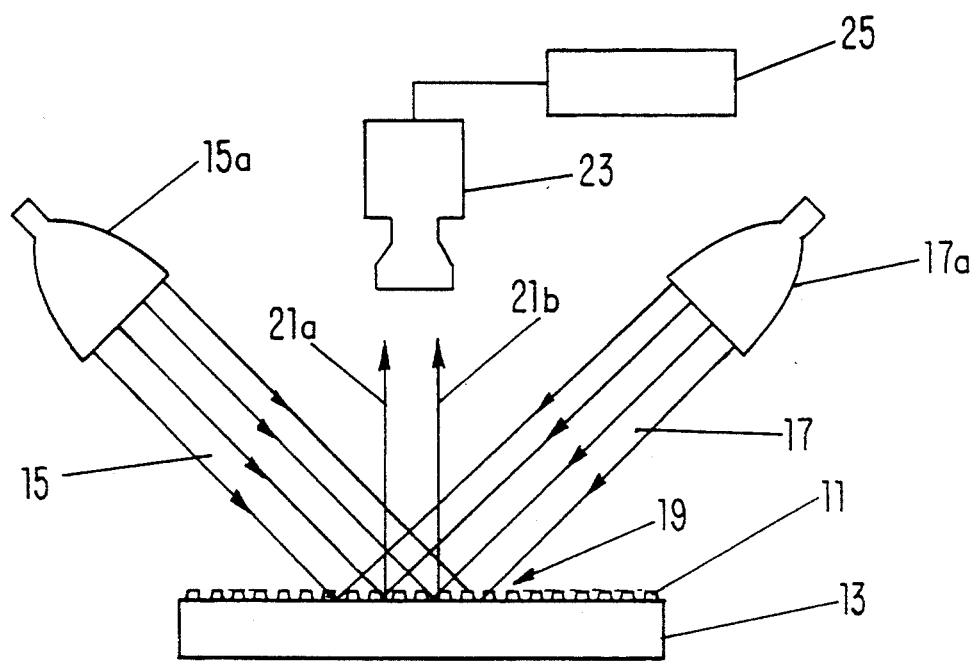
FIGS. 1 and 2 are diagrammatic views for purposes of explaining embodiments of the invention.

The present invention relies on interferometry using a diffraction grating on a wafer, which, as shown in FIG. 1, comprises a grating 11 imposed on the surface of a semiconductor wafer 13. Two incident beams of optical or other radiation 15 and 17 at angles to each other are used to set up a standing wave pattern 19 at the plane of the surface of the diffraction grating of the wafer. The standing wave pattern is produced by the mixing of the two beams 15 and 17 which, of course, must be coherent in order to establish the standing wave pattern.

The wavelength and angle of incidence of the beams 15 and 17 from sources 15a and 17a are arranged in a well known manner such that each beam gives rise to respective diffracted beams 21a and 21b perpendicular to the surface of the wafer 13. The interference between these two diffracted beams 21a and 21b beams provides an interference or fringe pattern containing the important displacement information which in turn permits alignment. In one embodiment of the invention this is based on the principle of moire interferometry and, as in all period difference moire interferometers, the observed interference or fringe pattern results from the period difference between two gratings in this case between the grating period on the wafer and twice the standing wave period, i.e., the period of the interferometrically established radiation intensity pattern.

In accordance with an embodiment of the invention, the interference pattern may be displayed and interpreted by a variety of suitable, well-known techniques. For example, as shown in FIG. 1, the diffracted beam 21 may be directed to a TV camera 23 and monitor 25 for display and analysis.

Figure 2:
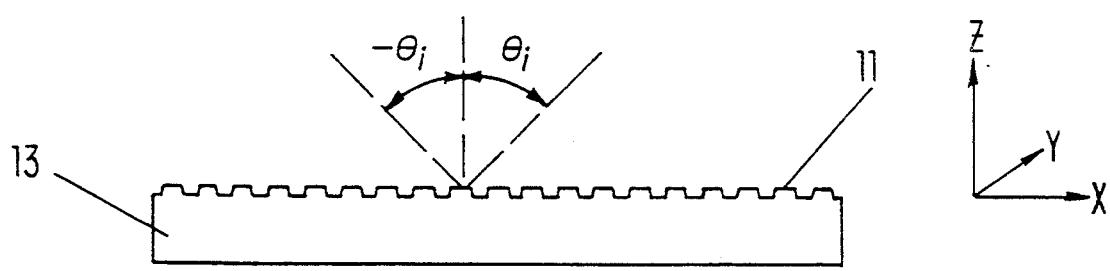

As stated, the fringe period depends on the two grating periods. In accordance with the principles of this invention, the phase of the fringe pattern is a direct measure of the alignment between the two patterns. A very simple calculation serves to demonstrate this. Referring to FIG. 2, starting with a beam incident at an angle $\theta_i$ and polarized perpendicular to the plane of incidence, the electric and magnetic fields for the incident beam can be written as:

$$E_i = e_y A \exp(ik\cos\theta_i z - ik\sin\theta_i x) \quad (1)$$

$$H_i = A(\cos\theta_i e_x + \sin\theta_i e_z)\exp(ik\cos\theta_i z - ik\sin\theta_i x) \quad (2)$$

where the grating is in the z=0 plane, the positive z-direction is above the grating and the grating lines are in the y-direction. Here $e_x$, $e_y$, and $e_z$ are unit vectors in the x, y, and z directions, respectively. Now, with the grating defined as f(z), $$f(z) = u \sin(gx + \phi) \quad (3)$$

where 2u is the grating peak-to-peak height, $2\pi/g$ is the grating period, and $\phi$ is the important phase term that we wish to measure. Calculation of the diffracted fields within the Rayleigh approximation (which holds for relatively small u) is straightforward; for the electric field the result is simply:

$$E_{diff} = -e_y(kucos\theta_i)exp(i\phi-ikz)$$

where it has been assumed that the incident angle and wavelength were chosen so that the diffracted wave is exactly normal to the wafer. Note that the phase information is contained in $E_{diff}$; but, as expected, the intensity of the diffracted order will be independent of the phase $\phi$. Now, if a second beam of equal intensity from the opposite direction $(-\theta_i)$ is added, the total diffracted field is readily calculated, viz.

$$E_{diff} = -Ae_y\{(kucos\theta_i)exp(i\phi-ikz)+exp(-i\phi-ikz)\} \quad (4)$$

and $$I_{diff} \propto A^2(kucos\theta_i)^2 sin^2\phi \quad (5)$$

where $I_{diff}$ is the intensity of the diffracted beam and $A^2$ is proportional to the intensity of the diffracted beam. Now the intensity is a sensitive function of $\phi$ as required. If the condition for perfectly normal diffracted beams is not met, the result will be a fringe pattern with a phase that oscillates as $sin^2\phi$ as the grating is moved relative to the interference pattern. In accordance with implementing an embodiment of the invention, it is important to average the incident beam parameters and the sorting pattern to illuminate several fringes of the interference pattern so that the phase may be unambiguously determined. This will ensure that extraneous intensity variations will not mistakenly be interpreted as alignment signals.

Figure 3:
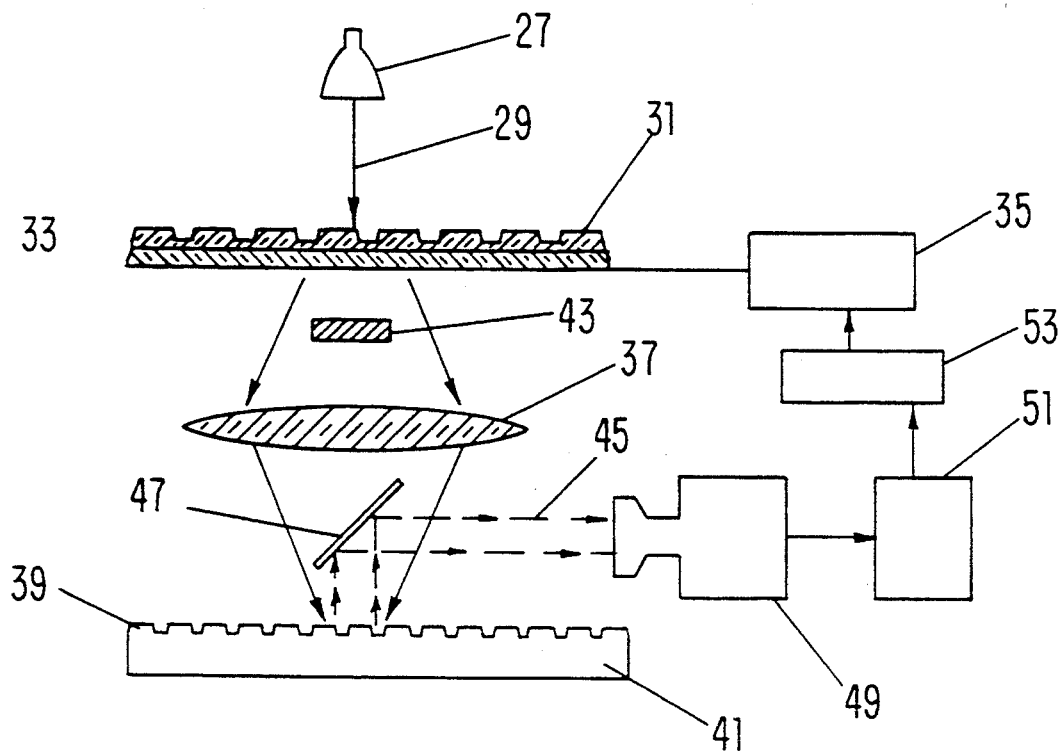
FIG. 3 is a diagrammatic view in partial section of an alignment arrangement in accordance with an embodiment of the invention; and, FIG. 4 is a diagrammatic plan view of diffraction gratings in accordance with an embodiment of the invention.

An arrangement for implementing alignment in accordance with an embodiment of the invention is shown in FIG. 3. Here a source 27 produces a collimated plane wave 29 incident on a transmission grating 31 that is part of a reticle 33 mounted on a reference body such as an optical stepper 35. Reticle grating 31 produces a pattern which is then imaged onto a second grating 39 on a semiconductor wafer 41. The periodicity function or characteristic of the grating 39 is slightly different from that of grating 31 after passing through the imaging optics of the stepper 37 so that interference or fringe patterns will be produced when the patterns from the respective gratings 31 and 39 are mixed. The zero order pattern from grating 31 is blocked by panel 43. The period of the reticle grating 31 is chosen sufficiently coarse so that at least the ±1-diffraction orders are imaged through the optical system.

In accordance with the invention, the highest sensitivity for measurement and alignment is achieved with the highest possible grating period. The period of the wafer grating 39 is chosen to be close to but different from the period of the image of the reticle grating 31 at the plane of wafer grating 39. These two periods are chosen to differ slightly so that there is provided a well-defined fringe pattern or beat frequency for observation and analysis. The two interfering diffracted orders indicated by the numerals 45 are reflected by mirror 47 and directed towards any suitable well known signal processing electronics indicated as a television or CCD camera/monitor 49 and signal processor 51. Further, any suitable well known controller unit 53 responsive to signals from processor 51 may be employed to control the stepper 35 so as to align grating 31 with grating 39 and thus align the wafer 41. Also, the particular positions of the blocking panel 43 and the mirror 47 may be altered or varied as dictated by the constraints of particular optical arrangements.

Consequently, in accordance with the invention there is provided an arrangement to monitor the phase of the diffracted signal by interference with another beam which has a different dependence on the alignment phase. This may be either a second diffracted beam as has been described above or reference beam that is coherent with the incident beam.

As indicated in connection with FIG. 4, instead of one dimensional gratings, other grating arrangements may be used such as a pair of gratings with lines at angles to each other as explained in connection with FIG. 4 or gratings having patterns that repeat in two dimensions such as bi-gratings which are well known in the art. Such arrangements provide information on alignment in two dimensions with a single measurement. Also, the half mirror 47 may be used to block the zero order fringes thus eliminating the need for panel 43, if desired.

Use of a fringe pattern in accordance with the invention to carry out this measurement of displacement for alignment purposes in small CD situations is extremely advantageous because of the multiplier or magnified effect of the rate of change in fringe patterns in relation to rate of change of relative displacement and is thus highly advantageous in comparison with single point displacement detection and measurement schemes.

Figure 4:
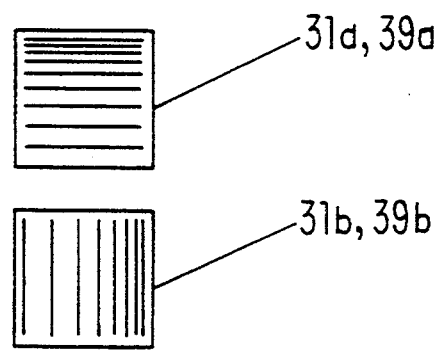

In accordance with the invention, as indicated in connection with FIG. 4, chirped grating pairs 31a, 39a, and 31b, 39b, i.e., gratings whose period varies along the length of the grating, respectively may be used on the reticle and the wafer instead of a single period grating. Chirping eliminates full-period degeneracy, and is similar to the use of chirped waveforms in Doppler radar to obtain range information on a scale shorter than the pulse duration.

The advantages provided by the invention include provision of a specific relation between grating period and wavelength to ensure that interference of diffraction orders would not be coupled, and provision of monitoring of a fringe pattern rather than of a single intensity. There is much more information contained in an interference pattern than in a single intensity image. Further, the interference pattern changes at a rate faster, by the ratio of the moire fringe spacing to the grating period, than the rate of change in the relative displacement between the stepper and the semiconductor wafer. This inherently produces a multiplier effect in the measurement of displacement so that significantly improved alignment accuracy can be achieved. Of course, any suitable well known signal processing techniques may be used to detect, correlate, and utilize for control purposes the information present in the moire fringe interference patterns. The optimal fringe density is not unity but is rather a small number, say three of four, of fringes across the interference pattern. Also, in addition to providing a simple arrangement, the present invention allows use of submicron gratings which improve sensitivity in contrast to the much larger grating periods used in other schemes.

What is claimed is:

1. In the manufacture of microelectronic and optoelectronic integrated circuitry, the method of enabling alignment of submicron lithographic features on surfaces at each level of the circuitry to within about one-third the critical dimension or less comprising the steps of:
a) establishing a pattern of images corresponding to waves diffracted from the surface of the level containing the lithographic features by passing a beam of radiation through a first diffraction grating associated with a reference body, said grating having a first periodicity characteristic, and impinging said pattern on a specimen diffraction grating of a periodicity different from that of said first diffraction grating, said specimen diffraction grating being located on the level of circuitry containing the lithographic features, changes in said pattern of images occurring at a rate which is a multiple of the rate of change of the relative displacement of the level of circuitry from a reference body, and
b) analyzing the changes in the pattern of images to determine the extent of actual displacement between the reference body and the level of circuitry to thereby enable alignment of the level with the body.

2. The method of claim 1 further including the step of:
a. removing zero order diffraction levels from said pattern.

3. The method of claim 1 wherein the pattern of images is a moire fringe pattern.

4. The method of claim 1 wherein the reference and specimen diffraction gratings each have a plurality of sets of parallel lines, each set being at angle to the other set.

5. The method of claim 1 wherein the first and second periodicity characteristics are constant.

6. The method of claim 1 wherein the first and second periodicity characteristics are aperiodic.

7. In the manufacture of microelectronic and optoelectronic circuitry, the method of enabling alignment of submicrometer lithographic features on two levels of a semiconductor or other wafer to within about one-third the critical dimension or less, comprising the steps of:
a. providing a submicrometer diffraction grating on the surface of one level of the wafer, said grating having a known positional relation with the lithographic features of the wafer;
b. illuminating said grating with an interferometrically established radiation intensity pattern having a predetermined relationship to the lithographic features in a subsequent level that is to be exposed, the radiation intensity pattern being selected so that the radiation diffracted from the illuminated grating forms a moire interference pattern with one or more moire fringes across the aperture of said grating, the phase of the moire interference pattern varying by up to about 360 degrees as the relative positions in the plane transverse to the radiation intensity pattern and the grating are varied, thus providing spatial amplification of the grating period for alignment purposes by the ratio of the moire fringe spacing to the grating period, and
c. monitoring the phase of the moire interference pattern to enable adjustment of the wafer relative to the radiation intensity pattern at the position of the grating on the wafer to provide the phase of the moire interference pattern that corresponds to an overlap or alignment of the corresponding features on the two lithography levels.

8. The method of claim 7 wherein the step of providing the radiation intensity pattern comprises the steps of:
a. passing a beam of radiation through a structure on a reference body with a transmission function having a first periodicity characteristic, and
b. impinging the radiation intensity pattern onto the diffraction grating, said diffraction grating having a periodicity characteristic different from said first periodicity characteristic.

9. Apparatus for aligning submicron lithographic features in the manufacture of microelectronic and optoelectronic levels of circuitry to within about one third of the critical dimension comprising:
a. first means having a fixed positional relation to a reference body for creating in response to radiation a first pattern of images having first periodicity characteristic;
b. second means located on a surface of a level of circuitry for creating in response to said radiation a second pattern of images having periodicity characteristic essentially slightly different from said first pattern, whereby in response to radiation projecting said first pattern onto said second means, there is diffracted from the surface of the second means a pattern of images of predetermined characteristics which, with relative movement between the first and second means, varies at a higher rate of change than the rate of change of the displacement of the second means from the first means, thereby providing a measure of relative displacement between the reference body and said second means with enhanced accuracy.

10. Apparatus for aligning submicron lithographic features in the manufacture of microelectronic and optoelectronic levels of circuitry to within about one third of the critical dimension comprising:
a) first means having a fixed positional relation to a reference body for creating in response to radiation in the optical range a first pattern of images;
b) second means located on a surface of a level of circuitry for creating in response to said radiation a second pattern of images essentially slightly different from said first pattern, whereby in response to radiation projecting said first pattern onto said second means, there is diffracted from the surface of the second means a pattern of images of predetermined characteristics which, with relative movement between the first and second means, varies at a higher rate of change than the rate of change in the displacement of the second means from the first means, thereby providing a measure of relative displacement between the reference body and said second means with enhanced accuracy.

11. Apparatus as in claim 10 wherein said first and second means each comprise one or more diffraction gratings.

12. Apparatus as in claim 11 wherein said first means further includes means for focusing said first pattern of images onto said second means.

13. Apparatus as in claim 11 wherein said first means further includes means for blocking zero order portions of the first pattern of images.

14. Apparatus as in claim 13 further comprising:
c. Means for receiving and analyzing changes in the interference pattern to provide a direct, real time measure of displacement.

* * * * *

UNITED STATES PATENT AND TRADEMARK OFFICE
CERTIFICATE OF CORRECTION

PATENT NO. : 5,343,292
DATED : August 30, 1994
INVENTOR(S) : Brueck et al.

It is certified that error appears in the above-identified patent and that said Letters Patent is hereby corrected as shown below:

Column 1, line 4, before "BACKGROUND" insert

--Government Rights

The U.S. Government has a paid-up license in this invention and the right in limited circumstances to require the patent owner to license others on reasonable terms as provided for by the terms of Contract No. 91-MC0502 with Semiconductor Research Corporation/Semantech.--

Signed and Sealed this

Twelfth Day of May, 1998

Attest:

BRUCE LEHMAN

*Attesting Officer*  *Commissioner of Patents and Trademarks*